METHOD OF MANUFACTURING SEMI-CONDUCTOR CRYSTALS

Filed Feb. 23, 1955

ROBERT G. POHL
*INVENTOR.*

*BY* John J. Pederson
HIS ATTORNEY.

United States Patent Office 2,950,219

Patented Aug. 23, 1960

2,950,219

METHOD OF MANUFACTURING SEMI-CONDUCTOR CRYSTALS

Robert G. Pohl, Chicago, Ill., assignor to The Rauland Corporation, a corporation of Illinois Filed Feb. 23, 1955, Ser. No. 489,833

10 Claims. (Cl. 148—1.5)

This invention relates to a new and improved method of producing metallic semi-conductor crystals having contiguous zones which exhibit different types of electrical conductivity; these crystals are employed in the manufacture of junction-type diodes, transistors, and similar devices.

Semi-conductor devices may be employed for a wide variety of purposes in electrical network; for example, devices of this type may be utilized as rectifiers, detectors, amplifiers, etc. Many of these devices are characterized by composite structures which include adjacent semi-conductor layers, usually germanium or silicon, having different types of conductivity. In one form of semi-conductor material, conductivity is theoretically considered to result from the apparent migration of positive charges or "holes"; this type of semi-conductor is generally referred to as having "p-type" conductivity. The other general form of semi-conductive material, normally referred to as "n-type," conducts electrical currents primarily by means of the movement or migration of negative charges or electrons.

Three different methods have heretofore been utilized for producing p-n junctions as used in diodes and junction transistors. In one of these processes, known as the alloy process, an "acceptor" modifier element such as indium or gallium is placed upon the surface of an n-type semi-conductor crystal and is heated so that some of the acceptor is diffused into the surface portion of the semi-conductor to form a p-type layer. The same technique may be applied to the formation of an n-type layer upon the surface of a p-type semi-conductor crystal by utilizing as a modifier a "donor" element such as antimony or arsenic.

In another of the prior art processes, a semi-conductor element is heated to form a melt and a donor impurity is added in predetermined quantities to that melt. A seed crystal is then brought into contact with the melt and recrystallization of the molten semi-conductive material is initiated. After a portion of the melt has been crystallized, an acceptor modifier is added to the melt in sufficient quantities that further crystallization of material from the melt creates a p-type crystal zone contiguous with the original n-type crystal. The process may be continued by further "doping" the melt with the donor impurity to produce an additional n-type zone; however, the process cannot be continued indefinitely because the semi-conductor melt soon contains too high a concentration of modifier elements to permit formation of useful crystals.

The third prior art technique for forming p-n junctions is somewhat similar to the second in that it comprises a crystal-growing procedure. In this third known process, however, the molten semi-conductor material, which may comprise silicon or germanium, is doped with both a donor modifier and an acceptor modifier. As before, recrystallization of the semi-conductor is initiated. In this instance, however, the rate of crystal growth is varied to determine the conductivity type of the crystal. This effect is made possible because the impurity or modifier concentration in the crystal, for different modifier elements, varies as a function of the growth rate. With proper selection of the modifier impurities and their concentrations in the melt, the conductivity of the crystallized material may be changed during crystallization by altering the growth rate of the crystal.

It is a primary object of the invention to provide a completely new and different method of producing a single semi-conductor crystal including at least two contiguous zones which exhibit different types of conductivity.

It is another object of the invention to provide a new and improved method of producing a continuous semi-conductor crystal including a plurality of contiguous zones of n-type and p-type conductivity.

It is a corollary object of the invention to provide a new and improved method of providing plural-zone semi-conductor crystals by techniques which are relatively simple and economical and which may be effectuated by means of relatively inexpensive apparatus.

In accordance with the invention, the method of producing a semi-conductor crystal having contiguous zones of n-type and p-type conductivity suitable for use in the manufacture of junction-type diodes, transistors, and similar devices comprises the following steps. A mass comprising a semi-conductor element such as germanium or silicon is heated to form a melt. This mass is doped with a donor modifier and an acceptor modifier; the modifiers may be added to the mass either before or after heating. One of the modifiers employed has a segregation factor which is substantially smaller than the segregation factor of the other modifier; the concentration in the melt of the modifier having the smaller segregation factor is made substantially greater than the concentration of the other modifier. A portion of the melt is then crystallized, without substantially agitating the melt, to form a first semi-conductor crystal zone in which the modifier having the smaller segregation factor constitutes the predominant impurity. Subsequently, the melt is effectively agitated while crystallization continues; this produces a second semi-conductive crystal zone, contiguous with the first zone, but having the modifier with the larger segregation factor as the predominant impurity. Because one of the modifiers is a donor and the other is an acceptor element, one of the crystal zones exhibits n-type conductivity whereas the other zone comprises p-type semi-conductive material.

The features of the invention which are believed to be novel are set forth with particularity in the appended claims. The organization and manner of operation of the invention, together with further objects and advantages thereof, may best be understood by reference to the following description taken in conjunction with the accompanying drawings, in which:

Figure 1:
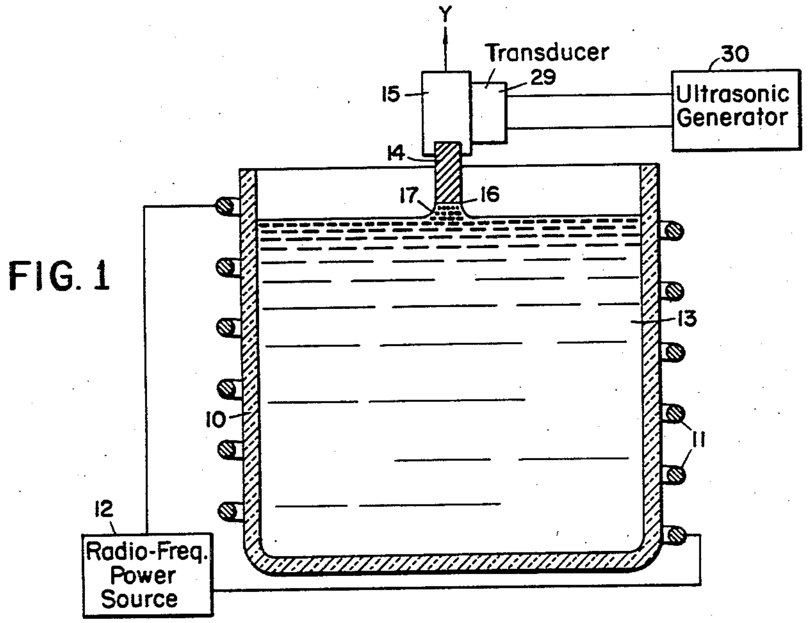
Figure 1 is a cross-sectional view, partly schematic, of a portion of one type of apparatus suitable for use in conjunction with the inventive process.

The apparatus illustrated in Figure 1 is of conventional form and corresponds generally to equipment employed to manufacture semi-conductor crystals and other types of crystalline metallic material. The apparatus comprises a crucible 10 which may be constructed from quartz, graphite, or other suitable material. An inductive heating coil 11 is positioned in encompassing relation to crucible 10 and is connected to a radio-frequency power source 12.

In conventional practice, crystalline semi-conductor material is formed by first placing in the crucible a mass comprising a semi-conductor element, such as silicon or germanium, and at least one type of modifier impurity. The impurity may be of the donor type, which comprises elements from the fifth group of the periodic table, or may be of the acceptor type from group three of the table. Other impurities, such as tin, lead, etc., may be present in minor quantities. Radio-frequency energy is then applied to coil 11 from source 12 so that the semi-conductor and the modifier impurity are induction-heated to form a melt 13. Preferably, the frequency of the electrical power supplied to coil 11 is high enough to avoid any appreciable agitation of melt 13.

A seed crystal 14, formed from the same semi-conductor element as the melt and of suitable size and crystal orientation, is then brought into contact with melt 13 and is subsequently withdrawn from the melt at a relatively slow speed as indicated by arrow Y. Seed crystal 14 may be held in a suitable clamp or receptacle 15, preferably formed from a material having a high thermal conductivity. As the seed crystal is withdrawn from the melt, material from the melt tends to adhere to the seed crystal because of surface tension and to crystallize as a continuation of crystal 14. The rate of withdrawal of the seed crystal and the rate of formation of crystallized material are maintained quite low (preferably ten inches per hour or less), and the temperature of the liquid-solid interface 16 between the crystallized material and melt 13 is maintained approximately at the recrystallization temperature of the semi-conductor element so that a long continuous crystal is formed by continuing accretion to crystal 14.

Because there are several different mechanisms available for immersing and withdrawing seed crystal 14 from melt 13, no specific example of this apparatus has been illustrated in the drawings. Either mechanical- or electrical-drive systems may, of course, be employed. Moreover, it will be understood that the entire process should be carried out in a vacuum or in an atmosphere comprising a gas or gases which cannot react with the semi-conductor; a hydrogen or inert gas atmosphere has been found suitable for this purpose where germanium comprises the semi-conductor. It may be necessary to provide means for cooling the material at interface 16; jets of hydrogen have sometimes been employed for this purpose.

The technique described above has been employed in the purification of crystalline metallic material and in similar processes; a particularly advantageous and useful process of this type for the manufacture of semi-conductor crystals exhibiting uniform electrical characteristics throughout their lengths is described and claimed in the co-pending application, now abandoned, of Robert G. Pohl, Serial No. 416,789, filed March 17, 1954, and assigned to the same assignee as the present application. On the other hand, if two modifier impurities, one a donor and the other an acceptor, are incorporated in melt 13, the same apparatus may be employed to produce a crystal comprising a number of zones of different conductivity types by varying the rate at which seed crystal 14 is withdrawn from the melt. This process is described in an article by R. N. Hall in the journal "Physical Review" for November 1952 at page 139.

The method of the present invention utilizes the general technique described above in connection with the apparatus of Figure 1 to produce multi-zone semi-conductive crystals having contiguous zones of different conductivity types. This effect is achieved without requiring any variation in the rate of crystal growth and, therefore, without necessitating any changes in the speed at which seed crystal 14 is withdrawn from melt 13. The process of the invention utilizes variations in the concentration of modifier elements in the crystallized material caused by changes in concentration of the impurities in the portion 17 of the liquid immediately adjacent interface 16 and further utilizes the effect of agitation upon impurity content in this portion 17 of the liquid.

Figure 2:
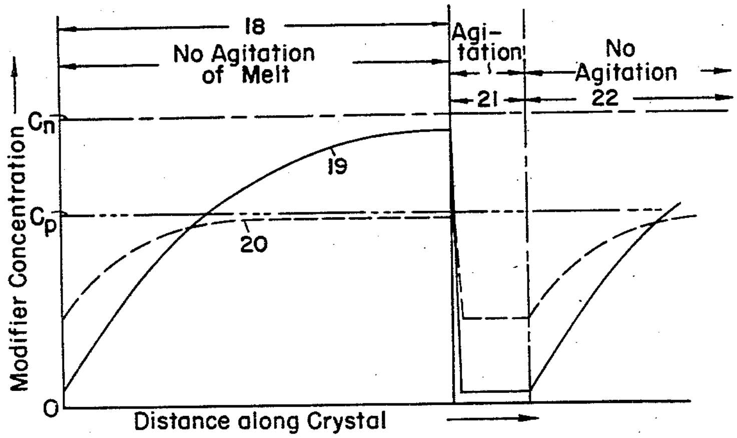
Figure 2 is an explanatory diagram showing changes in impurity concentrations within the crystallized semi-conductive material during the stages of the inventive process.

The process of the invention may best be understood by reference to Figure 2, in which concentrations of the donor impurity antimony and the acceptor modifier gallium in a crystal formed from a germanium melt are plotted as functions of distance along the crystal. This particular donor modifier, antimony, is characterized by a relatively small segregation factor $k_n$ (of the order of 0.005) when crystallized in germanium; segregation factor $k_n$ may be defined as the ratio of the concentration of the donor modifier in the crystallized semi-conductor material to the concentration of the same modifier element in the melt immediately adjacent the crystal-liquid interface. The acceptor modifier, gallium, selected for this particular example of the inventive process, on the other hand, has a relatively large segregation factor which may be of the order of 0.1. These segregation factors are generally referred to in the literature as segregation constants although they are at least partially dependent upon the rate of growth of the crystal and in some instances upon the temperature gradient at the liquid-crystal interface.

In a melt formed in accordance with one embodiment of the invention, the concentration $C_n$ of the antimony in melt 13 is made substantially greater than the concentration $C_p$ of the gallium in the melt. Crystal growth is then initiated in the manner described above and continued until a crystal of substantial length 18 has been formed. This portion of the crystal is grown at a constant velocity, and the melt is not appreciably agitated during the growth period. As a consequence, the concentration of the two modifier elements in the crystal varies considerably along length 18 of the crystal, as shown in Figure 2; the concentration of the donor impurity antimony in the crystal is shown by line 19 and the concentration of the acceptor modifier gallium in the crystal is indicated by dash line 20. As shown by curve 19, the concentration of the donor impurity in the crystal increases with increasing length and approaches the original donor concentration in the melt, $C_n$, as a limit. Similarly, the acceptor impurity concentration increases, asymptotically approaching the liquid concentration $C_p$.

The change in relative concentrations in the crystal is explained by the fact that as material from the melt is crystallized, most of the impurities are rejected from the crystal lattice and remain in the melt. These rejected impurities do not diffuse into the melt as rapidly as they are rejected; rather, they tend to accumulate in the portion 17 of the melt immediately adjacent liquid-solid interface 16 (Figure 1). This phenomenon is described and analyzed in considerable detail in the paper "Solute Redistribution by Recrystallization" by R. G. Pohl, "Journal of Applied Physics," published in September 1954, pages 1170–1178. As indicated in Table I of that paper, page 1177, after a crystal of appreciable length has been formed, the impurity concentration in the crystallized material is determined primarily by the original concentration of the impurity in the melt, although at the outset of the crystallization process the segregation factor is of equal importance in determining the impurity content of the crystal.

After length 18 of the crystal has been formed, conditions in the melt are altered by agitating the melt to rapidly diffuse the excess impurity concentration in portion 17 and re-establish the initial crystallization conditions. During agitation, growth of the crystal is continued through a length 21. Preferably, the crystal growth rate for lengths 18 and 21 remains essentially constant. The agitation may then be interrupted and a further length 22 of crystal material may be produced. Subsequently, after a substantial length of crystal material has been formed without agitation, melt portion 17 may again be agitated to re-establish the initial crystallization conditions; the process may thus be repeated many times.

Figure 3:
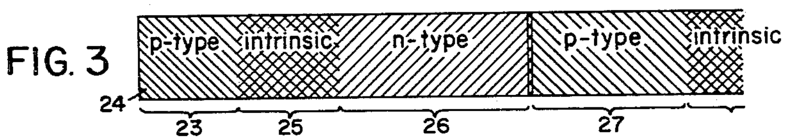
Figure 3 is a cross-sectional view of a semi-conductor crystal cross-hatched to indicate the types of conductivity exhibited by various portions of a crystal produced in accordance with the invention.

Figure 3 illustrates the conductivity characteristics of crystal material formed by the process described in connection with Figure 2. When crystallization is initiated, the acceptor impurity gallium constitutes the dominant impurity in the crystallized material, since the segregation factor for gallium in a germanium crystallization process is much higher than that of the donor antimony. Consequently, the initial portion 23 of the crystal 24 exhibits p-type conductivity. However, as crystallization continues and the relative concentrations of the two modifiers in the region 17 adjacent interface 16 change, the concentration of the donor modifier antimony in the crystal approaches and then surpasses that of the acceptor gallium. Thus, in the next portion 25 of crystal 24, the two modifiers are present in approximately equal concentrations and the crystallized material has the same conductivity characteristics as intrinsic germanium. As crystal growth continues, the concentrations of the two modifiers approach the initial melt concentrations $C_n$ and $C_p$; because the original donor concentration $C_n$ is substantially greater than the acceptor concentration $C_p$ an n-type crystal zone 26 is formed. The melt is then agitated to diffuse the excess impurities accumulated in melt portion 17 throughout the melt, re-establishing the original recrystallization conditions and forming a p-type zone 27 immediately contiguous to n-type zone 26. The process may then be repeated to form further zones similar to zones 26 and 27.

In order to achieve a rapid transition from the crystallization conditions under which n-type crystal zone 26 is formed to the orignal crystallization conditions to produce p-type zone 27, the relatively heavy impurity concentrations in melt region 17 must be dissipated rapidly. One effective method of making this transition is to vibrate the crystal rapidly, preferably at a supersonic frequency in order to obtain the advantages of cavitation phenomena in the liquid. As indicated in Figure 1, this may be accomplished by mounting an electromechanical transducer 29 on the crystal holder 15. Transducer 29 may then be energized from a suitable generator 30 of electrical energy at ultrasonic frequencies. The apparatus employed may be entirely conventional in form; for example, transducer 29 may comprise a piezo-electric crystal or magnetostrictive metal and generator 30 may comprise any of the many well known types of oscillators capable of providing substantial power at ultrasonic frequencies. The turbulence created in melt region 17 by vibration of the crystal rapidly reduces the impurity concentration in this portion of the melt to its initial value, so that the initial recrystallization conditions are re-established.

Of course, this technique requires that the volume of molten material in crucible 10 be relatively large as compared to the amount of material recrystallized. One other condition is essential to successful operation in accordance with the invention; the ratio of the donor segregation factor to the acceptor segregation factor must be larger than the inverse ratio of their initial concentrations in the melt. This requirement may be expressed mathematically by the relationship:

$$\frac{k_p}{k_n} > \frac{C_n}{C_p}$$

otherwise, it will not be possible to form p-type material from the melt by the method outlined above.

The process may also be carried out using a donor modifier which has a segregation factor relatively large in comparison with the segregation factor of the acceptor impurity employed. Thus, in a germanium melt, the acceptor modifier may comprise indium, which has a segregation factor of the order of 0.001, whereas the donor modifier may be phosphorus with a segregation factor of approximately 0.10. In this case, the relative concentrations of the two modifiers must be reversed and the ratios between the segregation factors and the concentrations must satisfy the relationship $$\frac{k_n}{k_p} > \frac{C_p}{C_n}$$

In general, therefore, a donor modifier, such as antimony, having a relatively small segregation factor may be utilized in conjunction with acceptor modifiers such as gallium, aluminum, and boron having relatively large segregation factors; donors with large segregation factors such as arsenic and phosphorus may be employed in conjunction with an acceptor having a small segregation factor such as indium. Moreover, the same technique may be applied where silicon is the semi-conductive material instead of germanium.

The precise initial impurity concentrations in the melt are subject to considerable variation within the limits outlined above, depending upon the electrical characteristics desired in the crystallized material. Generally speaking, these concentrations are usually of the order of $10^{16}$ modified atoms per cubic centimeter of germanium or silicon. The length 18 of material (Figure 2) to be crystallized prior to agitation of the melt is not a constant, but depends on the impurity concentrations employed and the rate of crystal growth. However, this factor may be readily determined for any particular impurity concentrations and growth rate by simple empirical methods, since the process is a physical one and may be readily repeated. By using a relatively large crucible, a substantial crystal including a plurality of p-n junctions may be formed without adding material to the melt and without changing the growth rate. Of course, the same techniques may be applied to other familiar recrystallization processes in which the crystallized material remains in the boat or crucible originally employed to hold the melt.

While particular embodiments of the present invention have been described, it is apparent that changes and modifications may be made without departing from the invention in its broader aspects. The aim of the appended claims, therefore, is to cover all such changes and modifications as fall within the true spirit and scope of the invention.

I claim:

1. In the manufacture of junction-type diodes, transistors, and similar devices, the method of producing a semi-conductor crystal having contiguous zones of n-type and p-type conductivity comprising the following steps: heating a mass comprising a semi-conductor to form a melt; doping said mass with a donor modifier and an acceptor modifier, one of said modifiers having a segregation factor substantially smaller than the segregation factor of the other modifier, the concentration of said one modifier in said melt being substantially greater than the concentration of said other modifier and the ratio of the larger of said segregation factors to the smaller being greater than the inverse ratio of the concentrations; crystallizing a portion of said melt with minimum agitation to form a first semi-conductor crystal zone in which said one modifier is the predominant impurity; and subsequently subjecting the part of said melt immediately adjacent the interface between said crystallized portion and said melt to substantial agitation while continuing crystallization to produce a second semiconductive crystal zone, contiguous with said first zone, in which said other modifier is the predominant impurity.

2. In the manufacture of junction-type diodes, transistors, and similar devices, the method of producing a semiconductor crystal having contiguous zones of n-type and p-type conductivity comprising the following steps: heating a mass comprising a semi-conductor to form a melt; doping said mass with a donor modifier and an acceptor modifier, one of said modifiers having a segregation factor substantially smaller than the segregation factor of the other modifier, the concentration of said one modifier in said melt being substantially greater than the concentration of said other modifier and the ratio of the larger of said segregation factors to the smaller being greater than the inverse ratio of the concentrations; crystallizing a portion of said melt with minimum agitation to form a first semi-conductor crystal zone in which said one modifier is the predominant impurity; and subsequently subjecting the part of said melt immediately adjacent the interface between said crystallized portion and said melt to substantial agitation by vibrating said crystallized portion at an ultrasonic rate while continuing crystallization to produce a second semi-conductive crystal zone, contiguous with said first zone, in which said other modifier is the predominant impurity.

3. In the manufacture of junction-type diodes, transistors, and similar devices, the method of producing a semi-conductor crystal having contiguous zones of n-type and p-type conductivity comprising the following steps: heating a mass comprising a semi-conductor to form a melt; doping said mass with a donor modifier and an acceptor modifier, one of said modifiers having a segregation factor substantially smaller than the segregation factor of the other modifier, the concentration of said one modifier in said melt being substantially greater than the concentration of said other modifier and the ratio of the larger of said segregation factors to the smaller being greater than the inverse ratio of the concentrations; crystallizing a portion of said melt with minimum agitation to form a first semi-conductor crystal zone in which said one modifier is the predominant impurity; and subsequently subjecting said melt to substantial agitation while continuing crystallization to produce a second semi-conductive crystal zone, contiguous with said first zone, in which said other modifier is the predominant impurity.

4. In the manufacture of junction-type diodes, transistors, and similar devices, the method of producing a semi-conductor crystal having contiguous zones of n-type and p-type conductivity comprising the following steps: heating a mass comprising a semi-conductor to form a melt; doping said mass to a predetermined concentration $C_n$ with a donor modifier having a segregation factor $k_n$; doping said mass to a concentration $C_p$ with an acceptor modifier having a segregation factor $k_p$ substantially larger than $k_n$ such that $$\frac{k_p}{k_n} > \frac{C_n}{C_p}$$

crystallizing a portion of said melt with minimum agitation to form a first semi-conductor crystal zone which exhibits n-type conductivity; and subsequently subjecting said melt to substantial agitation while continuing crystallization to produce a second semi-conductive crystal zone, contiguous with said first zone, which exhibits p-type conductivity.

5. In the manufacture of junction-type diodes, transistors, and similar devices, the method of producing a semi-conductor crystal having contiguous zones of n-type and p-type conductivity comprising the following steps: heating a mass comprising a semi-conductor to form a melt; doping said mass to a predetermined concentration $C_p$ with an acceptor modifier having a segregation factor $k_p$; doping said mass to a concentration $C_n$ with a donor modifier having a segregation factor $k_n$ substantially larger than $k_p$ such that $$\frac{k_n}{k_p} > \frac{C_p}{C_n}$$

crystallizing a portion of said melt with minimum agitation to form a first semi-conductor crystal zone which exhibits p-type conductivity; and subsequently subjecting said melt to substantial agitation while continuing crystallization to produce a second semi-conductive crystal zone, contiguous with said first zone, which exhibits n-type conductivity.

6. In the manufacture of junction-type diodes, transistors, and similar devices, the method of producing a semi-conductor crystal having contiguous zones of n-type and p-type conductivity comprising the following steps: heating a mass comprising a semi-conductor to form a melt; doping said mass with a donor modifier and an acceptor modifier, one of said modifiers having a segregation factor substantially smaller than the segregation factor of the other modifier, the concentration of said one modifier in said melt being substantially greater than the concentration of said other modifier and the ratio of the larger of said segregation factors to the smaller being greater than the inverse ratio of the concentrations; crystallizing a portion of said melt with minimum agitation to form a crystal of predetermined length having a zone, immediately adjacent the interface between said crystal and said melt, in which said one modifier is the predominant impurity; and subsequently subjecting said melt to substantial agitation while continuing crystallization to produce a second semi-conductive crystal zone, contiguous with said first zone, in which said other modifier is the predominant impurity.

7. In the manufacture of junction-type diodes, transistors, and similar devices, the method of producing a semi-conductor crystal having contiguous zones of n-type and p-type conductivity comprising the following steps: heating a mass comprising germanium to form a melt; doping said mass with antimony as a donor modifier and an acceptor modifier from the group consisting of gallium, boron, and aluminum, the concentration of said donor modifier in said melt being substantially greater than the concentration of said acceptor modifier and the ratio of the larger of said segregation factors to the smaller being greater than the inverse ratio of the concentrations; crystallizing a portion of said melt with minimum agitation to form a first semi-conductor crystal zone in which said donor modifier is the predominant impurity; and subsequently subjecting said melt to substantial agitation while continuing crystallization to produce a second semi-conductive crystal zone, contiguous with said first zone, in which said acceptor modifier is the predominant impurity.

8. In the manufacture of junction-type diodes, transistors, and similar devices, the method of producing a semi-conductor crystal having contiguous zones of n-type and p-type conductivity comprising the following steps: heating a mass comprising germanium to form a melt; doping said mass with a donor modifier from the group consisting of arsenic and phosphorus and with indium as an acceptor modifier, the concentration of said acceptor modifier in said melt being substantially greater than the concentration of said donor modifier and the ratio of the larger of said segregation factors to the smaller being greater than the inverse ratio of the concentrations; crystallizing a portion of said melt with minimum agitation to form a first semi-conductor crystal zone in which said acceptor modifier is the predominant impurity; and subsequently subjecting said melt to substantial agitation while continuing crystallization to produce a semi-conductive crystal zone, contiguous with said first zone, in which said donor modifier is the predominant impurity.

9. In the manufacture of junction-type diodes, transistors, and similar devices, the method of producing a semi-conductor crystal having contiguous zones of n-type and p-type conductivity comprising the following steps: heating a mass comprising a semi-conductor element to form a melt; doping said mass with a donor modifier and an acceptor modifier, one of said modifiers having a segregation factor substantially smaller than the segregation factor of the other modifier, the concentration of said one modifier in said melt being substantially greater than the concentration of said other modifier and the ratio of the larger of said segregation factors to the smaller being greater than the inverse ratio of the concentrations; crystallizing a portion of said melt at a constant growth rate and with minimum agiation to form a first semi-conductor crystal zone in which said one modifier is the predominant impurity; and subsequently subjecting said melt to substantial agitation while continuing crystallization without changing the growth rate to produce a second semi-conductive crystal zone, contiguous with said first zone, in which said other modifier is the predominant impurity.

10. A method for forming a semi-conductive crystal which includes at least two closely spaced rectifying junctions, comprising the steps of preparing a melt comprising semiconductor and donor and acceptor impurities, inserting a seed crystal of the semi-conductor into the melt, raising the seed from the melt at a constant rate for uplifting material therefrom which freezes and becomes part of the crystal, and during such raising changing the rate of stirring of the melt at least two times within an interval of time corresponding in terms of crystal growth to the separation between said two closely spaced junctions, from a rate at which the uplifted material crystallizes as of one conductivity type to one at which the uplifted material crystallizes as of the opposite conductivity type.

References Cited in the file of this patent

UNITED STATES PATENTS

| | | |
|---|---|---|
| 2,689,930 | Hall | Sept. 21, 1954 |
| 2,727,840 | Teal | Dec. 20, 1955 |
| 2,730,470 | Shockley | Jan. 10, 1956 |
| 2,743,200 | Hannay | Apr. 24, 1956 |
| 2,835,614 | Pohl | May 20, 1958 |

FOREIGN PATENTS

| | | |
|---|---|---|
| 1,065,523 | France | Jan. 13, 1954 |